(12) United States Patent
Xu et al.

(10) Patent No.: US 11,978,996 B2
(45) Date of Patent: May 7, 2024

(54) TUNABLE EXTERNAL CAVITY LASER WITH DUAL GAIN CHIPS

(71) Applicant: INSTITUTE OF SEMICONDUCTORS, CHINESE ACADEMY OF SCIENCES, Beijing (CN)

(72) Inventors: Changda Xu, Beijing (CN); Dechao Ban, Beijing (CN); Wenhui Sun, Beijing (CN); Wei Chen, Beijing (CN); Ninghua Zhu, Beijing (CN); Ming Li, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 247 days.

(21) Appl. No.: 17/550,046

(22) Filed: Dec. 14, 2021

(65) Prior Publication Data

US 2022/0255284 A1   Aug. 11, 2022

(51) Int. Cl.
  *H01S 3/106*  (2006.01)
  *H01S 3/00*   (2006.01)
  *H01S 3/10*   (2006.01)

(52) U.S. Cl.
  CPC ......... *H01S 3/1062* (2013.01); *H01S 3/0064* (2013.01); *H01S 3/10061* (2013.01)

(58) Field of Classification Search
  CPC .. H01S 3/1062; H01S 3/0064; H01S 3/10061; H01S 5/4062; H01S 5/4068;

(Continued)

(56) References Cited

U.S. PATENT DOCUMENTS

| 5,070,505 A * | 12/1991 | Dixon | H01S 3/09415 |
| | | | 372/99 |
| 2002/0054614 A1 * | 5/2002 | Jin | H01S 5/141 |
| | | | 372/20 |

(Continued)

FOREIGN PATENT DOCUMENTS

| CN | 101404382 | 4/2009 |
| CN | 101859981 | 10/2010 |

(Continued)

OTHER PUBLICATIONS

Office Action issued to 202011513301.6 dated Nov. 2, 2021 (7 pages).

*Primary Examiner* — Xinning(Tom) Niu
(74) *Attorney, Agent, or Firm* — Barnes & Thornburg LLP

(57) ABSTRACT

A tunable external cavity laser with dual gain chips, including: a polarization beam splitter having a beam splitting surface arranged at an angle of 45° with respect to a first direction and a second direction perpendicular to the first direction; a first gain chip arranged in the first direction; a second gain chip arranged in the second direction; a feedback cavity arranged in the first direction, wherein the feedback cavity and the first gain chip are respectively arranged on two opposite sides of the polarization beam splitter, and the feedback cavity includes at least one independent Fabry-Perot etalon, at least one air gap Fabry-Perot cavity and a mirror that are arranged in the first direction. The polarization beam splitter and the two gain chips cooperate to share the feedback cavity, so that a wavelength and a phase may be adjusted, and a larger tuning range may be obtained.

9 Claims, 3 Drawing Sheets

(58) Field of Classification Search
CPC .... H01S 5/4087; H01S 3/08054; H01S 3/105; H01S 3/07; H01S 3/0823; H01S 5/142; H01S 5/14; H01S 5/0607
See application file for complete search history.

(56) References Cited

U.S. PATENT DOCUMENTS

| | | | |
|---|---|---|---|
| 2002/0136104 A1* | 9/2002 | Daiber | G02F 1/21 |
| | | | 369/44.23 |
| 2003/0012250 A1* | 1/2003 | Shirasaki | H01S 5/141 |
| | | | 372/98 |
| 2013/0343413 A1* | 12/2013 | Gao | H01S 5/142 |
| | | | 372/20 |
| 2014/0016657 A1* | 1/2014 | Shu | H01S 5/4062 |
| | | | 372/44.01 |

FOREIGN PATENT DOCUMENTS

| | | |
|---|---|---|
| CN | 103323957 | 9/2013 |
| CN | 105529613 | 4/2016 |
| WO | WO-2020196957 A1 * | 10/2020 |

* cited by examiner

TUNABLE EXTERNAL CAVITY LASER WITH DUAL GAIN CHIPS

CROSS REFERENCE

This application claims priority of Chinese Patent Application No. 202011513301.6 filed on Dec. 18, 2020 in the China National Intellectual Property Administration, the content of which is incorporated herein by reference in entirety.

TECHNICAL FIELD

The present disclosure relates to a field of semiconductor laser technology, and in particular to a tunable external cavity laser with dual gain chips.

BACKGROUND

With the development of optical fiber communications, lasers have become indispensable optical devices for studies, lives and social communications of people. In the optical fiber communication, different application scenarios have different requirements for laser performance. The implementation of the coherent optical communication requires the support of light source with narrow line width and high side mode suppression ratio. In an external cavity laser, a feedback cavity is coupled on a side of a gain chip, which may increase an intracavity lifetime of photons and reduce a spectral width. Furthermore, by providing a wavelength selection device in the feedback cavity, output light may be tuned to a plurality of wavelengths. Therefore, the external cavity laser is a tunable narrow-line-width laser that is particularly suitable to serve as a light source for the coherent optical communication.

Existing external cavity lasers generally adopt a structure including a gain chip and a feedback cavity. A diffraction grating or an interference filter is provided in the feedback cavity to select a wavelength and narrow a line width, and a wavelength tuning may be achieved by using motions of the diffraction grating device and the interference filter device. A tuning range is mainly restricted by two aspects. The first aspect is an output band of the gain chip, and the second aspect is a tuning range of a wavelength selection device. Taking a variable-spacing air gap Fabry-Perot cavity as an example of the wavelength selection device, when an air gap spacing is 11±0.5 um, a resonant wavelength of the air gap Fabry-Perot cavity may cover C+L band. At present, however, common gain chips may only cover the C band or the L band, so that the tuning range of the external cavity laser is limited by the output band of the gain chip. The technical problem to be solved now is the small tuning range of the external cavity laser.

SUMMARY

In order to solve the above technical problem and expand the tuning range of the external cavity laser, the present disclosure provides a tunable external cavity laser with dual gain chips, and a specific solution is as follows.

A tunable external cavity laser with dual gain chips is provided, comprising:
a polarization beam splitter having a beam splitting surface arranged at an angle of 45° with respect to a first direction and a second direction;
a first gain chip arranged in the first direction, wherein light emitted by the first gain chip is incident on the beam splitting surface in the first direction, and is transmitted through the polarization beam splitter;
a second gain chip arranged in the second direction, wherein light emitted by the second gain chip is incident on the beam splitting surface in the second direction, and is reflected in the first direction; and
a feedback cavity arranged in the first direction, wherein the feedback cavity and the first gain chip are respectively arranged on opposite sides of the polarization beam splitter, and the feedback cavity comprises at least one independent Fabry-Perot etalon, at least one air gap Fabry-Perot cavity and a mirror that are arranged in the first direction;
wherein the first direction is perpendicular to the second direction.

According to some embodiments of the present disclosure, the air gap Fabry-Perot cavity comprises a first Fabry-Perot etalon and a second Fabry-Perot etalon arranged side by side in the first direction, the first Fabry-Perot etalon is fixedly arranged, the second Fabry-Perot etalon is provided with a first movable component, and the mirror is provided with a second movable component.

According to some embodiments of the present disclosure, the first movable component and the second movable component comprise a piezoelectric ceramic sheet or a thermal expansion component.

According to some embodiments of the present disclosure, the polarization beam splitter is configured to transmit P-polarized light and reflect S-polarized light;
a first polarizer is provided between the first gain chip and the polarization beam splitter, and the first polarizer is configured to transmit the P-polarized light; and
a second polarizer is provided between the second gain chip and the polarization beam splitter, and the second polarizer is configured to transmit the S-polarized light.

According to some embodiments of the present disclosure, the feedback cavity comprises a plurality of independent Fabry-Perot etalons having free spectral ranges different from each other.

According to some embodiments of the present disclosure, an extension direction of a plate of one or more of the plurality of independent Fabry-Perot etalons is arranged at a β angle with respect to the second direction, two adjacent independent Fabry-Perot etalons are arranged at different β angles, and the β angle ranges from 0° to 3°.

According to some embodiments of the present disclosure, a high reflective film is provided on two sides of the at least one independent Fabry-Perot etalon.

According to some embodiments of the present disclosure, the feedback cavity comprises a plurality of air gap Fabry-Perot cavities.

According to some embodiments of the present disclosure, an extension direction of a plate of the plurality of air gap Fabry-Perot etalons is arranged at a β angle with respect to the second direction, two adjacent air gap Fabry-Perot etalons are arranged at different β angles, and the β angle ranges from 0° to 3°.

According to some embodiments of the present disclosure, high-reflective films are provided on a side of the first Fabry-Perot etalon and a side of the second Fabry-Perot etalon that are opposite to each other, and anti-reflective films are provided on the other side of the first Fabry-Perot etalon and the other side of the second Fabry-Perot etalon.

Through the above technical solution, the polarization beam splitter and the two gain chips cooperate to share one feedback cavity. The feedback cavity includes an independent Fabry-Perot etalon and an air gap Fabry-Perot cavity, so that an adjustment of wavelength and phase may be achieved, and a larger tuning range may be obtained.

Figure 1:
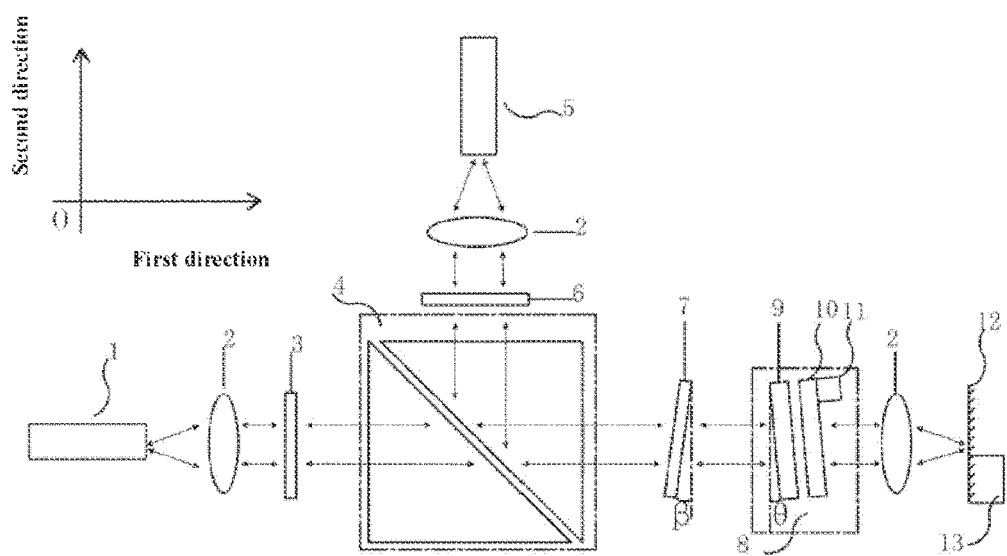
FIG. 1 schematically shows a schematic structural diagram of a tunable external cavity laser with dual gain chips according to the embodiments of the present disclosure.

Wherein, reference numeral 1 represents a first gain chip; 2 represents a lens; 3 represents a first polarizer; 4 represents a polarization beam splitter; 5 represents a second gain chip; 6 represents a second polarizer; 7 represents an independent Fabry-Perot etalon; 8 represents an air gap Fabry-Perot cavity; 9 represents a first Fabry-Perot etalon; 10 represents a second Fabry-Perot etalon; 11 represents a first movable component; 12 represents a mirror; 13 represents a second movable component.

DETAILED DESCRIPTION OF EMBODIMENTS

In order to make objectives, technical solutions and advantages of the present disclosure clearer, the present disclosure will be further described in detail below in connection with specific embodiments and with reference to the drawings.

It should be understood, however, that these descriptions are merely exemplary and are not intended to limit the scope of the present disclosure. In the following detailed description, for ease of interpretation, many specific details are set forth to provide a comprehensive understanding of the embodiments of the present disclosure. However, it is clear that one or more embodiments may also be implemented without these specific details. In addition, in the following description, descriptions of well-known technologies are omitted to avoid unnecessarily obscuring the concept of the present disclosure.

The terms used herein are for the purpose of describing specific embodiments only, and are not intended to limit the present disclosure. The terms "including" used herein indicate the presence of the feature, step and operation, but do not exclude the presence or addition of one or more other features, steps and operations.

Figure 4:
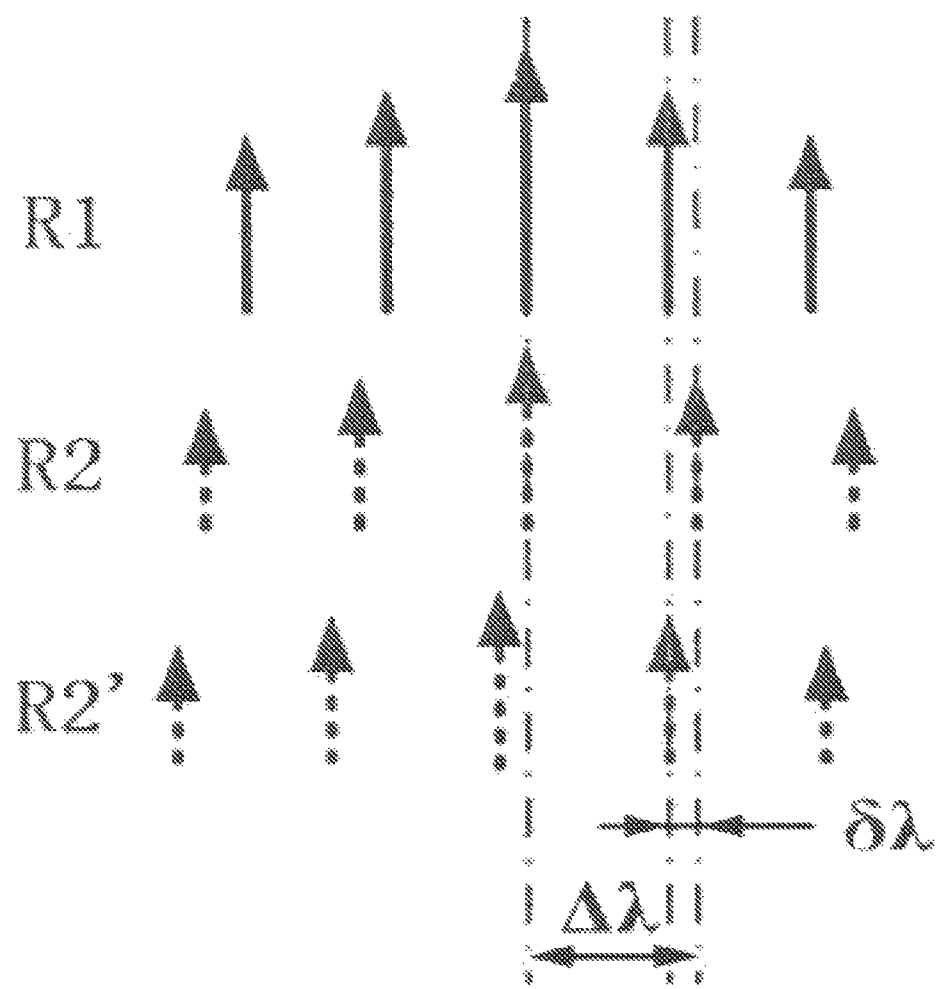
FIG. 4 schematically shows a schematic diagram of a principle of a vernier effect of a tunable external cavity laser with dual gain chips according to the embodiments of the present disclosure.

All the terms used herein (including technical and scientific terms) have the meanings generally understood by those skilled in the art, unless otherwise defined. It should be noted that, the terms used herein shall be interpreted to have meanings consistent with the context of the specification, and shall not be interpreted in an idealized or too rigid way. For example, a polarization beam splitter is an optical element formed by applying a multi-layer film structure on an inclined surface of a right-angle prism and then gluing into a cube structure, which may completely transmit P-polarized components and reflect most (at least 90%) of S-polarized components after light passes through the multi-layer film structure a plurality of times at Brewster's angle, by using characteristics that P-polarized light has a transmittance of 1 and S-polarized light has a transmittance of less than 1 when the light is incident at the Brewster's angle, wherein a surface where inclined surfaces of two right-angle prisms intersect is a beam splitting surface. Another example is a vernier effect, which refers to that each Fabry-Perot etalon may produce an independent comb-shaped resonance peak, and when one of the comb-shaped resonance peaks moves to the left and right in a small range, a coincident position of a plurality of comb-shaped resonance peaks may greatly change, and a resonance wavelength may therefore be changed in a wide range. Specifically, as shown in FIG. 4, a coincident position of peak R1 and peak R2 is initially at a middle position. When R2 changes to R2', the resonant peak changes by $\delta\lambda$, and the coincident position changes by $\Delta\lambda$. A small change in the resonant peak finally results in a wide-range change in the coincident position, that is, a wavelength at the coincident position is a wavelength of the light emitted by the laser.

In order to expand a tuning range of the external cavity laser, the present disclosure provides a tunable external cavity laser with dual gain chips, which may effectively expand the tuning range of the external cavity laser.

FIG. 1 schematically shows a schematic structural diagram of a tunable external cavity laser with dual gain chips according to the embodiments of the present disclosure.

As shown in FIG. 1, a tunable external cavity laser with dual gain chips may include a polarization beam splitter 4, a first gain chip 1, a second gain chip 5 and a feedback cavity. The feedback cavity includes at least one independent Fabry-Perot etalon 7, at least one air gap Fabry-Perot cavity 8 and a mirror 12 that are arranged in a first direction.

According to some embodiments of the present disclosure, a beam splitting surface of the polarization beam splitter 4 may be arranged at an angle of 45° with respect to both the first direction and a second direction.

According to some embodiments of the present disclosure, the first direction is perpendicular to the second direction.

Figure 2:
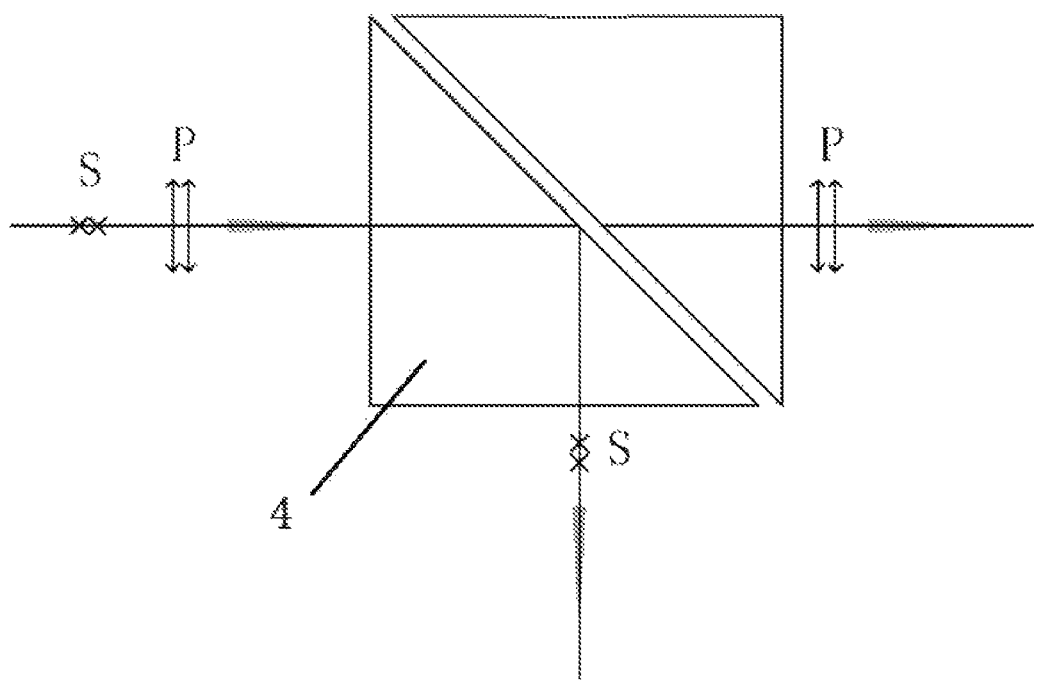
FIG. 2 schematically shows a schematic diagram of an operating principle of a polarization beam splitter of a tunable external cavity laser with dual gain chips according to the embodiments of the present disclosure.

FIG. 2 schematically shows a schematic diagram of an operating principle of a polarization beam splitter of a tunable external cavity laser with dual gain chips according to the embodiments of the present disclosure.

As shown in FIG. 2, according to some embodiments of the present disclosure, a mixture of P-polarized light and S-polarized light is incident on the beam splitting surface from a side surface of the polarization beam splitter 4. The P-polarized light is transmitted and exits from a surface of the polarization beam splitter 4 opposite to the incident surface, and the S-polarized light is reflected and exits from a surface of the polarization beam splitter 4 adjacent to the incident surface.

According to some embodiments of the present disclosure, the first gain chip 1 is arranged in the first direction, and the light emitted by the first gain chip is incident on the beam splitting surface in the first direction, and is transmitted through the polarization beam splitter 4. The light transmitted through the polarization beam splitter 4 may enter the feedback cavity for an adjustment of a wavelength and a phase.

According to some embodiments of the present disclosure, a lens 2 is provided between the first gain chip 1 and the polarization beam splitter 4.

According to some embodiments of the present disclosure, optionally, the lens 2 is a collimating lens used to adjust the light emitted by the first gain chip 1 to be parallel to the first direction.

According to some embodiments of the present disclosure, the second gain chip 5 is arranged in the second direction, and the light emitted by the second gain chip 5 is incident on the beam splitting surface in the second direction and is reflected in the first direction. The reflected light may enter the feedback cavity for an adjustment of a wavelength and a phase.

According to some embodiments of the present disclosure, a lens 2 is provided between the second gain chip 5 and the polarization beam splitter 4.

According to some embodiments of the present disclosure, optionally, the lens 2 is a collimating lens used to adjust the light emitted by the second gain chip 5 to be parallel to the second direction.

According to some embodiments of the present disclosure, the first gain chip 1 may be a C-band gain chip, and the second gain chip 5 may be an L-band gain chip.

According to some embodiments of the present disclosure, the feedback cavity is arranged in the first direction. The feedback cavity and the first gain chip 1 are respectively arranged on two opposite sides of the polarization beam splitter 4. The feedback cavity includes at least one independent Fabry-Perot etalon 7, at least one air gap Fabry-Perot cavity 8 and a mirror 12 that are arranged in the first direction.

According to some embodiments of the present disclosure, the air gap Fabry-Perot cavity 8 includes a first Fabry-Perot etalon 9 and a second Fabry-Perot etalon 10 arranged side by side in the first direction. The first Fabry-Perot etalon 9 is fixedly arranged, the second Fabry-Perot etalon 10 is provided with a first movable component 11, and the mirror 12 is provided with a second movable component 13.

According to some embodiments of the present disclosure, a distance between the first Fabry-Perot etalon 9 and the second Fabry-Perot etalon 10 may be adjusted by the first movable component 11, so as to achieve a coarse tuning of the wavelength of the light.

According to some embodiments of the present disclosure, a position of the mirror may be adjusted by the second movable component 13, so as to achieve a fine tuning of the phase of the light.

According to some embodiments of the present disclosure, the first movable component 11 and the second movable component 13 may include a piezoelectric ceramic sheet or a thermal expansion component.

According to some embodiments of the present disclosure, the piezoelectric ceramic sheet may control a movement of the first movable component 11 and the second movable component 13 through voltage, or the thermal expansion component may control the movement of the first movable component 11 and the second movable component 13 through temperature.

According to some embodiments of the present disclosure, the polarization beam splitter 4 is configured to transmit the P-polarized light and reflect the S-polarized light.

Figure 3:
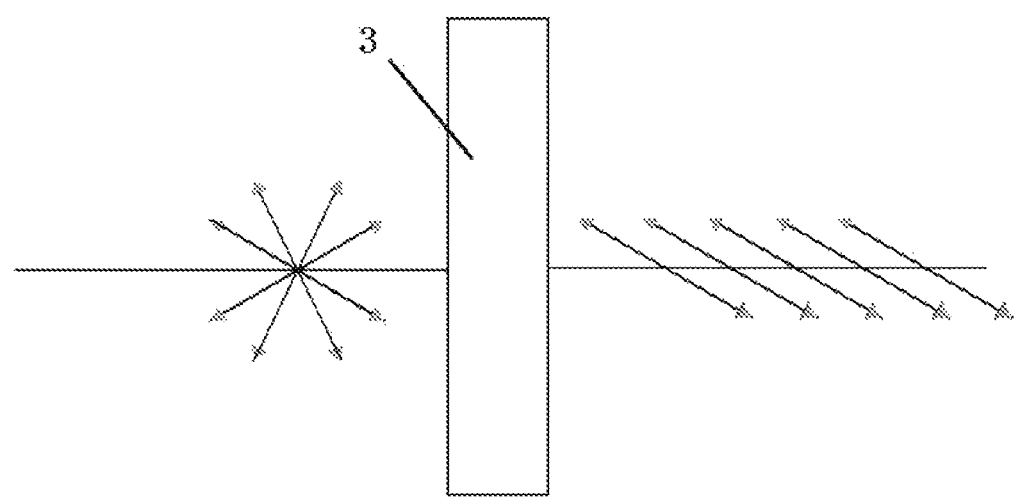
FIG. 3 schematically shows a schematic diagram of an operating principle of a first polarizer of a tunable external cavity laser with dual gain chips according to the embodiments of the present disclosure.

FIG. 3 schematically shows a schematic diagram of an operating principle of a first polarizer of a tunable external cavity laser with dual gain chips according to the embodiments of the present disclosure.

As shown in FIG. 3, according to some embodiments of the present disclosure, a first polarizer 3 may filter out non-P-polarized light in the incident light, and only allow the P-polarized light to pass through.

According to some embodiments of the present disclosure, the first polarizer 3 is provided between the first gain chip 1 and the polarization beam splitter 4, and the first polarizer 3 may transmit the P-polarized light. The first polarizer 3 may select the P-polarized light from the light emitted by the first gain chip 1 and allow the P-polarized light to be transmitted to the polarization beam splitter 4.

According to some embodiments of the present disclosure, a second polarizer 6 is provided between the second gain chip 5 and the polarization beam splitter 4, and the second polarizer 6 may transmit the S-polarized light. The second polarizer 6 may select the S-polarized light from the light emitted by the second gain chip 5 and allow the S-polarized light to be transmitted to the polarization beam splitter 4.

According to some embodiments of the present disclosure, the feedback cavity may include a plurality of independent Fabry-Perot etalons 7 having free spectral ranges different from each other. The Fabry-Perot etalons with different cavity modes may jointly select a lasing mode of the external cavity laser by using a vernier effect.

The vernier effect is applied in the present disclosure to select common wavelengths in passable wavebands of independent Fabry-Perot etalons 4, so as to improve an accuracy of the tunable external cavity laser.

According to some embodiments of the present disclosure, the feedback cavity may include a plurality of independent Fabry-Perot etalons 7, with which an effect of narrowing a line width may be further improved. Optionally, an appropriate number of independent Fabry-Perot etalons 7 may be selected by considering a processing difficulty and a processing effect.

According to some embodiments of the present disclosure, an extension direction of a plate of one or more independent Fabry-Perot etalons 7 is arranged at a β angle with respect to the second direction, and two adjacent independent Fabry-Perot etalons 7 are arranged at different β angles so as to prevent generating a resonance and affecting a tuning effect. The β angle may range from 0° to 3°.

According to some embodiments of the present disclosure, high reflective films are provided on two sides of the at least one independent Fabry-Perot etalon 7, so as to make the light internally oscillate in the independent Fabry-Perot etalon 7.

According to some embodiments of the present disclosure, the feedback cavity may include a plurality of air gap Fabry-Perot cavities 8.

According to some embodiments of the present disclosure, an extension direction of a plate of the plurality of air gap Fabry-Perot etalons 8 may be arranged at a β angle with respect to the second direction. Two adjacent air gap Fabry-Perot etalons 8 may be arranged at different β angles so as to prevent generating a resonance and affecting a tuning effect. The β angle may range from 0° to 3°.

According to some embodiments of the present disclosure, high-reflective films are provided on a side of the first Fabry-Perot etalon 9 and a side of the second Fabry-Perot etalon 10 that are opposite to each other, and anti-reflective films are provided on the other side of the first Fabry-Perot etalon 9 and the other side of the second Fabry-Perot etalon 10, so as to make the light oscillate in an air cavity between the first Fabry-Perot etalon 9 and the second Fabry-Perot etalon 10.

According to some embodiments of the present disclosure, a Fabry-Perot etalon with a free spectral range of 100 Ghz that meets ITU specifications is adopted.

According to some embodiments of the present disclosure, an air gap Fabry-Perot cavity with an initial spacing of about 11 um is adopted, and a corresponding movable component 1 has a moving range of 1 um and a stepping accuracy at nanometer level. For this air gap Fabry-Perot cavity, the free spectral range may reach 100 nm, the spacing may change by 5 nm to 6 nm, and a corresponding resonant wavelength may change by 100 Ghz. Therefore, the C+L band may be covered with a tuning interval of 100 Ghz.

Through the above technical solution, the polarization beam splitter and the two gain chips may cooperate to share the feedback cavity. The feedback cavity includes the independent Fabry-Perot etalon and the air gap Fabry-Perot cavity, so that the wavelength and the phase may be adjusted. In the entire external cavity laser, the two gain chips share the feedback cavity and have independent optical paths. The gain chip for lasing may be selected according to actual needs, so that the tuning range may be expanded and a larger tuning range may be obtained.

So far, the embodiments of the present disclosure have been described in detail with reference to the drawings. It should be noted that implementation manners that are not shown or described in the drawings or the description are all in the forms known to those of ordinary skill in the art, and are not described in detail. In addition, the above definitions of the various components and elements are not limited to the specific structures, shapes or manners mentioned in the embodiments, which may be simply changed or replaced by those of ordinary skill in the art.

It should be further noted that in the specific embodiments of the present disclosure, unless otherwise known to the contrary, numerical parameters in the specification and the appended claims are approximate values and may be changed according to required characteristics obtained through the content of the present disclosure. Specifically, all numbers used in the specification and claims to indicate a size of the composition, a range condition, etc., should be understood as being defined by the term "about" in all cases. In general, the expression refers to a change of ±10% in some embodiments, a change of ±5% in some embodiments, a change of ±1% in some embodiments, and a change of ±0.5% in some embodiments.

Those skilled in the art may understand that the various embodiments of the present disclosure and/or the features described in the claims may be combined in various ways, even if such combinations are not explicitly described in the present disclosure. In particular, without departing from the spirit and teachings of the present disclosure, the various embodiments of the present disclosure and/or the features described in the claims may be combined in various ways. All these combinations fall within the scope of the present disclosure.

The specific embodiments of the present disclosure further describe in detail the objectives, the technical solutions and the advantageous of the present disclosure. It should be understood that the above only illustrate the specific embodiments of the present disclosure, and are not intended to limit the present disclosure. Any modifications, equivalent substitutions, improvements, etc., made within the spirit and scope of the present disclosure shall be included within the scope of the present disclosure.

What is claimed is:

1. A tunable external cavity laser with dual gain chips, comprising:
    a polarization beam splitter having a beam splitting surface arranged at an angle of 45° with respect to a first direction and a second direction;
    a first gain chip arranged in the first direction, wherein light emitted by the first gain chip is incident on the beam splitting surface in the first direction, and is transmitted through the polarization beam splitter;
    a second gain chip arranged in the second direction, wherein light emitted by the second gain chip is incident on the beam splitting surface in the second direction, and is reflected in the first direction; and
    a feedback cavity arranged in the first direction, wherein the feedback cavity and the first gain chip are respectively arranged on opposite sides of the polarization beam splitter, and the feedback cavity comprises at least one independent Fabry-Perot etalon, at least one air gap Fabry-Perot cavity and a mirror that are arranged in the first direction;
    wherein the first direction is perpendicular to the second direction; and
    wherein the air gap Fabry-Perot cavity comprises a first Fabry-Perot etalon and a second Fabry-Perot etalon arranged side by side in the first direction, the first Fabry-Perot etalon is fixedly arranged, the second Fabry-Perot etalon is provided with a first movable component, and the mirror is provided with a second movable component.

2. The laser of claim 1, wherein the first movable component and the second movable component comprise a piezoelectric ceramic sheet or a thermal expansion component.

3. The laser of claim 1, wherein,
    the polarization beam splitter is configured to transmit P-polarized light and reflect S-polarized light;
    a first polarizer is provided between the first gain chip and the polarization beam splitter, and the first polarizer is configured to transmit the P-polarized light; and
    a second polarizer is provided between the second gain chip and the polarization beam splitter, and the second polarizer is configured to transmit the S-polarized light.

4. The laser of claim 1, wherein the feedback cavity comprises a plurality of independent Fabry-Perot etalons having free spectral ranges different from each other.

5. The laser of claim 4, wherein an extension direction of a plate of one or more of the plurality of independent Fabry-Perot etalons is arranged at a β angle with respect to the second direction, two adjacent independent Fabry-Perot etalons are arranged at different β angles, and the β angle ranges from 0° to 3°.

6. The laser of claim 1, wherein a high reflective film is provided on two sides of the at least one independent Fabry-Perot etalon.

7. The laser of claim 1, wherein the feedback cavity comprises a plurality of air gap Fabry-Perot cavities.

8. The laser of claim 7, wherein an extension direction of a plate of the plurality of air gap Fabry-Perot etalons is arranged at a β angle with respect to the second direction, two adjacent air gap Fabry-Perot etalons are arranged at different β angles, and the β angle ranges from 0° to 3°.

9. The laser of claim 7, wherein high-reflective films are provided on a side of the first Fabry-Perot etalon and a side of the second Fabry-Perot etalon that are opposite to each other, and anti-reflective films are provided on the other side of the first Fabry-Perot etalon and the other side of the second Fabry-Perot etalon.

* * * * *